United States Patent
Pu et al.

(10) Patent No.: US 9,425,411 B2
(45) Date of Patent: Aug. 23, 2016

(54) ORGANIC ELECTROLUMINESCENT ELEMENT

(71) Applicant: NATIONAL UNIVERSITY CORPORATION YAMAGATA UNIVERSITY, Yamagata (JP)

(72) Inventors: Yong-Jin Pu, Yonezawa (JP); Takayuki Chiba, Yonezawa (JP); Junji Kido, Yonezawa (JP); Sei Satoh, Yonezawa (JP); Kazushige Ideta, Yonezawa (JP)

(73) Assignee: NATIONAL UNIVERSITY CORPORATION YAMAGATA UNIVERSITY, Yamagata (JP)

( * ) Notice: Subject to any disclaimer, the term of this patent is extended or adjusted under 35 U.S.C. 154(b) by 55 days.

(21) Appl. No.: 14/378,700

(22) PCT Filed: Feb. 15, 2013

(86) PCT No.: PCT/JP2013/053644
§ 371 (c)(1),
(2) Date: Aug. 14, 2014

(87) PCT Pub. No.: WO2013/122182
PCT Pub. Date: Aug. 22, 2013

(65) Prior Publication Data
US 2016/0020406 A1    Jan. 21, 2016

(30) Foreign Application Priority Data
Feb. 15, 2012 (JP) ................... 2012-030781

(51) Int. Cl.
*H01L 51/50* (2006.01)
*H01L 51/00* (2006.01)
*H01L 51/52* (2006.01)

(52) U.S. Cl.
CPC ......... *H01L 51/0072* (2013.01); *H01L 51/004* (2013.01); *H01L 51/006* (2013.01);
(Continued)

(58) Field of Classification Search
CPC ............. H01L 51/504; H01L 51/5012; H01L 51/5088; H01L 51/5092
See application file for complete search history.

(56) References Cited

U.S. PATENT DOCUMENTS 4,405,938 A * 9/1983 Nobutoki ................ H01J 29/45
                                                                  313/385
4,775,820 A * 10/1988 Eguchi ................... H05B 33/12
                                                                  252/583

(Continued)

FOREIGN PATENT DOCUMENTS

JP    2006-74022 A    3/2006
JP    2007-214228 A   8/2007

(Continued)

OTHER PUBLICATIONS

International Search Report (PCT/ISA/210) mailed on May 28, 2013, by the Japanese Patent Office as the International Searching Authority for International Application No. PCT/JP2013/053644.

(Continued)

Primary Examiner — Ida M Soward
(74) Attorney, Agent, or Firm — Buchanan, Ingersoll & Rooney PC

(57) ABSTRACT

To provide an organic electroluminescent element that can attain efficiency improvement by forming an electron injection layer by a film that is stable and excellent in uniformity, and forming a charge generation layer capable of effectively exhibiting the function. In an organic electroluminescent element provided with at least one organic layer between a pair of electrodes, an electron injection layer comprising a ZnO-containing layer, and a charge generation layer containing an electron acceptor-containing film in contact with the cathode side thereof and an electron donor-containing film adjacent thereto are formed.

10 Claims, 6 Drawing Sheets

(52) U.S. Cl.
CPC ....... *H01L51/0059* (2013.01); *H01L 51/5092* (2013.01); *H01L 51/0058* (2013.01); *H01L 51/504* (2013.01); *H01L 51/5004* (2013.01); *H01L 51/5012* (2013.01); *H01L 51/5072* (2013.01); *H01L 51/5088* (2013.01); *H01L 51/5221* (2013.01); *H01L 51/5278* (2013.01); *H01L 2251/305* (2013.01)

(56) References Cited

U.S. PATENT DOCUMENTS

| | | | | |
|---|---|---|---|---|
| 4,816,359 | A * | 3/1989 | Nagele | H01M 4/137 429/213 |
| 5,200,668 | A * | 4/1993 | Ohashi | H01L 33/18 257/E33.004 |
| 5,484,922 | A * | 1/1996 | Moore | H05B 33/14 313/503 |
| 5,656,401 | A * | 8/1997 | Ohta | B43K 8/08 430/20 |
| 5,759,726 | A * | 6/1998 | Tambo | C09B 47/067 430/59.4 |
| 5,834,894 | A * | 11/1998 | Shirasaki | H01L 51/5012 313/503 |
| 5,837,391 | A * | 11/1998 | Utsugi | H01L 27/3209 313/503 |
| 5,858,564 | A * | 1/1999 | Tamura | H05B 33/14 252/301.16 |
| 5,932,362 | A * | 8/1999 | Nagai | H01L 51/5012 313/503 |
| 5,972,247 | A * | 10/1999 | Shi | C09K 11/06 252/301.16 |
| 6,069,442 | A * | 5/2000 | Hung | H01L 51/5012 313/504 |
| 6,166,488 | A * | 12/2000 | Arai | H01L 51/5012 313/503 |
| 6,180,267 | B1 * | 1/2001 | Toguchi | H01L 51/005 313/504 |
| 7,759,033 | B2 * | 7/2010 | Yagi | G03G 5/08221 430/58.1 |
| 7,829,907 | B2 * | 11/2010 | Ide | H01L 27/3209 257/89 |
| 8,026,510 | B2 * | 9/2011 | Mori | H01L 51/105 257/40 |
| 8,866,134 | B2 * | 10/2014 | Iljima | C07D 471/04 257/213 |
| 2006/0027830 | A1 | 2/2006 | Kumaki et al. | |
| 2007/0182320 | A1 | 8/2007 | Nakamura | |
| 2009/0079342 | A1 | 3/2009 | Kumaki et al. | |
| 2009/0128024 | A1 | 5/2009 | Fukuoka et al. | |
| 2011/0241007 | A1 | 10/2011 | Kumaki et al. | |
| 2011/0315968 | A1 | 12/2011 | Nowatari et al. | |
| 2012/0012820 | A1 | 1/2012 | Endo et al. | |
| 2012/0184755 | A1 * | 7/2012 | Osaka | C07D 307/91 549/460 |
| 2012/0206038 | A1 * | 8/2012 | Hatano | H05B 33/26 313/505 |
| 2012/0280220 | A1 * | 11/2012 | Inoue | C07F 15/0033 257/40 |
| 2014/0190550 | A1 * | 7/2014 | Loh | H01L 51/445 136/244 |
| 2015/0318493 | A1 * | 11/2015 | Kadoma | C07D 403/10 544/230 |

FOREIGN PATENT DOCUMENTS

| | | |
|---|---|---|
| JP | 4273132 B2 | 6/2009 |
| JP | 2009-212238 A | 9/2009 |
| JP | 2012-22953 A | 2/2012 |
| JP | 2012-28318 A | 2/2012 |
| WO | WO 2007/123061 A1 | 11/2007 |
| WO | WO 2011/162105 A1 | 12/2011 |
| WO | WO 2012/160714 A1 | 11/2012 |

OTHER PUBLICATIONS

Office Action issued by the Chinese Patent Office in corresponding Chinese Patent Application No. 201380009394.0 on Oct. 30, 2015 (6 pages).

* cited by examiner

ORGANIC ELECTROLUMINESCENT ELEMENT

TECHNICAL FIELD

The present invention relates to an organic electroluminescent element (hereinafter, abbreviated as organic EL element), which can attain improvement of luminous efficiency by providing a charge generation layer, and enables all coating-type lamination.

BACKGROUND ART

Methods of forming each constituent layer, such as an organic layer, in production of organic electronic devices including an organic EL element, are loosely divided into dry processes by way of a deposition method or the like, and wet processes by way of a coating method using a solution in which an organic material is dissolved in an organic solvent.

The dry process has an advantage that a uniform film can be formed to have a desired film thickness, substantially without contamination of moisture, oxygen or impurities, since an organic layer and a metal are formed as films usually under a high vacuum of $10^{-4}$ to $10^{-6}$ Pa. Further, since the organic layer, the metal oxide and the metal can be continuously formed as films, thus it is easy to attain a high efficiency of an element and optimization of an element structure by providing each layer with discrete function. On the other hand, the method has problems in that uniform film forming in a large area is difficult, a material usage efficiency is low, cost is high, and the like.

On the other hand, the wet process has a comparatively simple film forming process and allows flexible film forming of a large area at low cost, thus attracts attention in recent years, and is also used in research and development of organic electronic devices such as, not only an organic EL element, but also an organic transistor, an organic thin film solar cell, and the like.

Specific method includes coating methods such as a spin coating method, a casting method and a spray method, as well as immersing methods such as a dip method, a self-organization method and an LB method, and printing methods such as an ink-jet method, a screen printing method and a roll-to-roll method.

In the coating method by way of a spin coating method, film forming is performed to have a desired film thickness by dissolving an organic material in various solvents and controlling the dropping amount and concentration of the solution, the number of revolutions of a spin coater and the like, in the atmosphere or under an inert gas atmosphere in a glove box or the like.

The electron injection layer in the coating-type organic electronic device conventionally employs metals such as Ba and Ca that are water-soluble or alcohol-soluble and have a low work function, in combination with Al or the like, but these metals are very active, thus are susceptible to moisture or oxygen in the atmosphere and are unstable.

Further, it is often the case that an organic material used in a coating-type organic electronic device is essentially unipolar, i.e., it has a charge transport property which allows transport of either holes or electrons. Thus, there is an electric charge which passes to an electrode and does not contribute to electric charge recombination, and there is also a problem that such low carrier balance causes the organic electronic device to reduce its efficiency.

Therefore, in order to attain a high efficiency of the coating-type organic electronic device, an electron injection layer or an electron transport layer that can prevent the electric charge from passing through due to its laminated structure, and is stable and applicable in the atmosphere, is required.

In response to this, for example, Patent Literature 1 describes that a liquid material containing an aryl compound having a PO group and an alkali metal ion or alkaline-earth metal ion obtained by being dissolved in alcohol is applied to form an electron transport layer, whereby an electron injection property and an electron transport property can be improved.

On the other hand, Patent Literature 2 describes that, use of an organic-inorganic composite material in which zinc oxide (ZnO) particles and an aryl compound having a PO group are combined can improve the electron injection property and the electron transport property without using an alkali metal, an alkaline-earth metal, and a compound thereof.

CITATION LIST

Patent Literatures

Patent Literature 1: JP 4273132 B1
Patent Literature 2: JP 2009-212238 A

SUMMARY OF INVENTION

Problems to be Solved by the Invention

In the methods described in Patent Literatures 1 and 2, the alkali metal, the alkaline-earth metal or ZnO for the electron injection material or electron transport material is formed into a composite material with the predetermined aryl compound having a PO group, and is solubilized in alcohol and applied.

However, there are problems that in the case where the electron injection layer is formed of such materials, when an electrode is formed thereon by a vacuum deposition method or the like, sufficient adhesion of an electrode film is not obtained, and concentration distribution of the electron injection material in the electron injection layer tends to become non-uniform.

Also, in the organic EL element of a multi-photon emission structure (hereinafter abbreviated as MPE element) where a plurality of luminescence units are stacked in series via a charge generation layer, an electron injection layer is formed on the anode side of the charge generation layer, and as this material, a ultra-thin film of metal such as Cs, Li and LiF/Al with a film thickness of 1 nm or less is formed by a deposition method.

The electron injection layer of the ultra-thin film as described above is unstable in the material itself, and when formed in a large area, the film thickness tends to become non-uniform, and functions of adjacent charge generation layer sometimes cannot be sufficiently exhibited.

Therefore, in order to attain efficiency improvement of the organic EL element, a layer constitution in which an electron injection layer can be formed by a film that is stable and excellent in uniformity, and the charge generation layer capable of sufficiently exhibiting the function, is required.

The present invention has been made to solve the above technical problems, and an object is to provide an organic EL element that can attain efficiency improvement by forming an electron injection layer by a film that is stable and excellent in uniformity, and forming a charge generation layer capable of effectively exhibiting the function.

Solution to Problem

The organic EL element according to the present invention is an organic EL element provided with at least one organic layer between a pair of electrodes, comprising an electron injection layer comprising a ZnO-containing layer, and a charge generation layer containing an electron acceptor-containing film formed in contact with the cathode side thereof and an electron donor-containing film adjacent thereto.

By forming the electron injection layer and charge generation layer as described above, it is possible to improve a film forming property and attain efficiency improvement of the organic EL element.

The ZnO-containing layer preferably comprises any of a ZnO film only, a laminate of a ZnO film and a binder film, a mixed film of ZnO and an alkali metal compound, a mixed film of ZnO, an alkali metal compound and a binder, a laminate of a ZnO film and a mixed film of an alkali metal compound and a binder, a mixed film of ZnO, an alkaline-earth metal compound and a binder, a laminate of a ZnO film and a mixed film of an alkaline-earth metal compound and a binder, a mixture of ZnO and an organic donor compound, and a laminate of a ZnO film and an organic donor compound film.

The ZnO-containing layer as described above can be formed as a coated film and attains improvement of a film forming property.

The alkali metal compound functions as n-dope, and is excellent in an electron injection property, thus any lithium phenolate salt among lithium oxide ($Li_2O$), cesium oxide ($Cs_2O$), lithium carbonate ($Li_2CO_3$), cesium carbonate ($Cs_2CO_3$), and sodium 8-quinolinolate (hereinafter abbreviated as Naq), lithium 8-quinolinolate (hereinafter abbreviated as Liq), lithium 2-(2-pyridyl)phenolate (hereinafter abbreviated as Lipp) and lithium 2-(2',2''-bipyridine-6'-yl) phenolate (hereinafter abbreviated as Libpp) shown in the following (Chemical Formula 1) is suitably used.

[Chemical Formula 1]

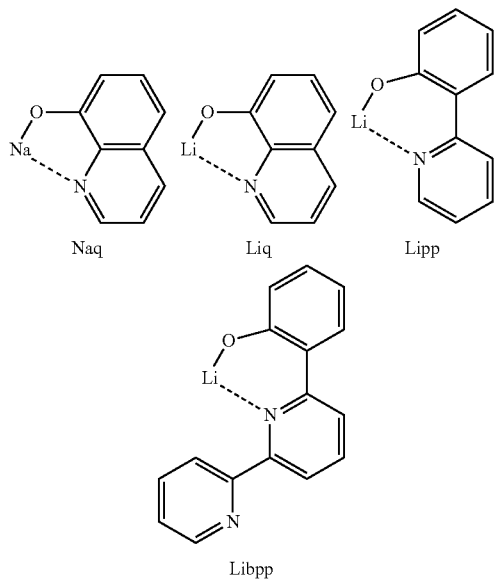

Also, the binder is preferably any of poly(4-vinylpyridine) (hereinafter abbreviated as PVPy), poly(2-vinylpyridine), poly[4-(4-vinylphenyl)pyridine] (hereinafter abbreviated as PVPhPy), poly[5-vinyl-2,2'-bipyridine] (hereinafter abbreviated as PVBiPy), poly[2-(4-vinylphenyl)pyridine] (hereinafter abbreviated as PVPh2Py) and poly[3-(4-vinylphenyl)pyridine] (hereinafter abbreviated as PVPh3Py) shown in the following (Chemical Formula 2).

[Chemical Formula 2]

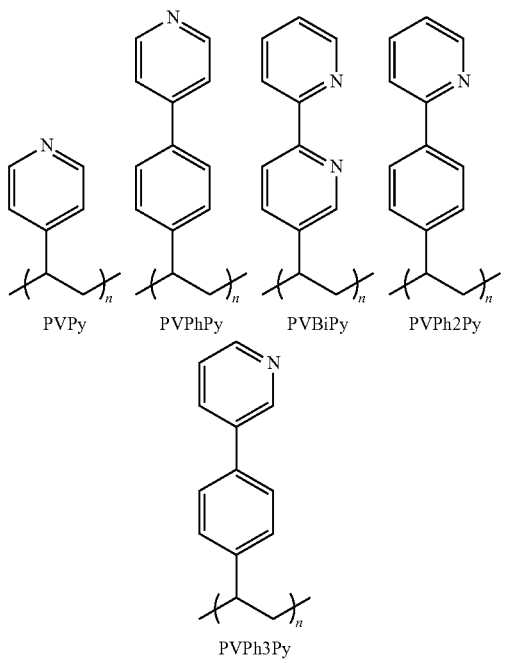

Further, the organic donor compound is preferably any of a group of compounds shown in the following (Chemical Formula 3).

[Chemical Formula 3]

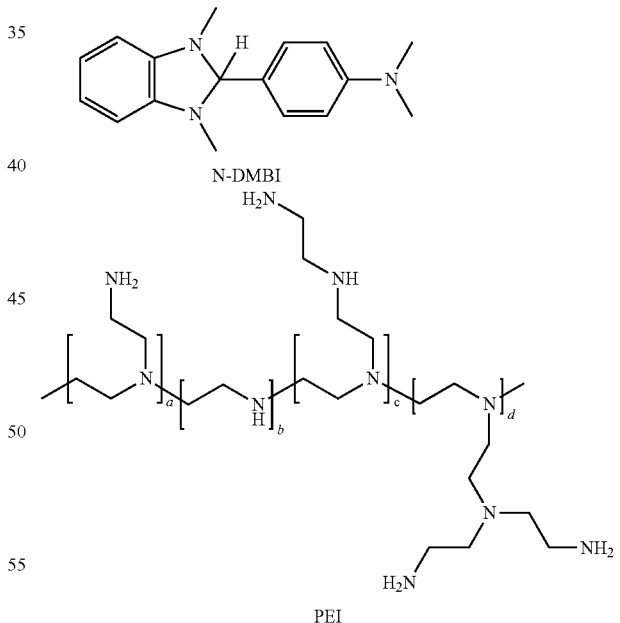

a, b, c and d are natural numbers

Moreover, the electron acceptor-containing film can be constituted by an electron acceptor only, or a mixture of an electron acceptor and a binder.

The electron acceptor is preferably a metal oxide having a Fermi level deeper than $(-A+1.5)$ eV or an organic electron acceptor having a LUMO level deeper than $(-A+1.5)$ eV, based on HOMO level $(-A$ eV$)$ of an electron donor of the electron donor-containing film adjacent to the cathode side of the electron acceptor-containing film.

By using the electron acceptor as described above, the charge generation layer can be allowed to effectively function.

The electron acceptor is preferably any of molybdenum oxide ($MoO_3$), tungsten oxide ($WO_3$), vanadium oxide ($V_2O_5$), 1,4,5,8,9,11-hexaazatriphenylene-hexacarbonitrile (hereinafter abbreviated as HAT-CN6), 2,3,5,6-tetrafluoro-7,7,8,8-tetracyanoquinodimethane (hereinafter abbreviated as F4-TCNQ) and fluorinated copper phthalocyanine (hereinafter abbreviated as FCuPc) shown in the following (Chemical Formula 4).

[Chemical Formula 4]

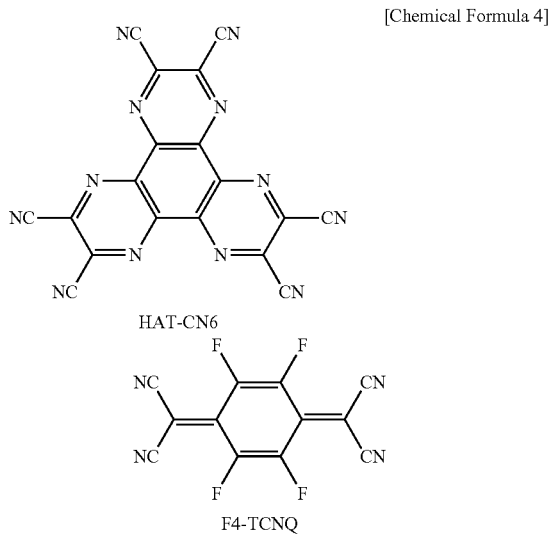

HAT-CN6

F4-TCNQ

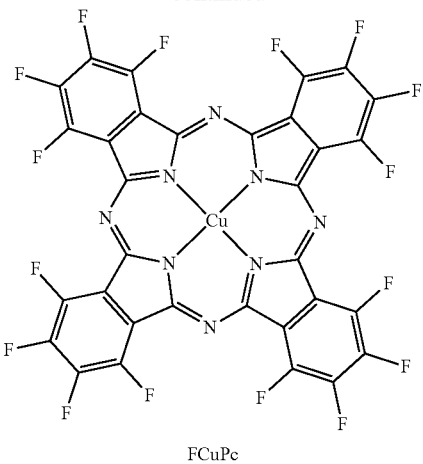

FCuPc

The binder comprising the mixture with the electron acceptor is preferably any of N,N'-di[(1-naphthalenyl)-N,N'-diphenyl]-1,1'-biphenyl)-4,4'-diamine (hereinafter abbreviated as NPD) and N,N'-diphenyl-N,N'-bis[4-[bis(3-methylphenyl)amino]phenyl]-1,1'-biphenyl-4,4'-diamine (hereinafter abbreviated as DNTPD) shown in the following (Chemical Formula 5), or polymethyl methacrylate (hereinafter abbreviated as PMMA) and PVPhPy.

[Chemical Formula 5]

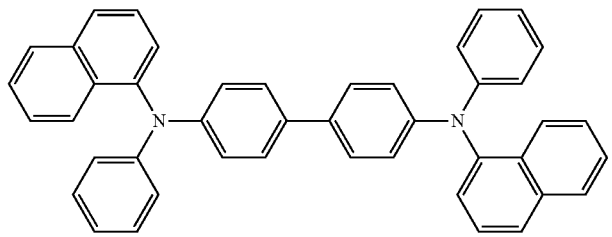

NPD

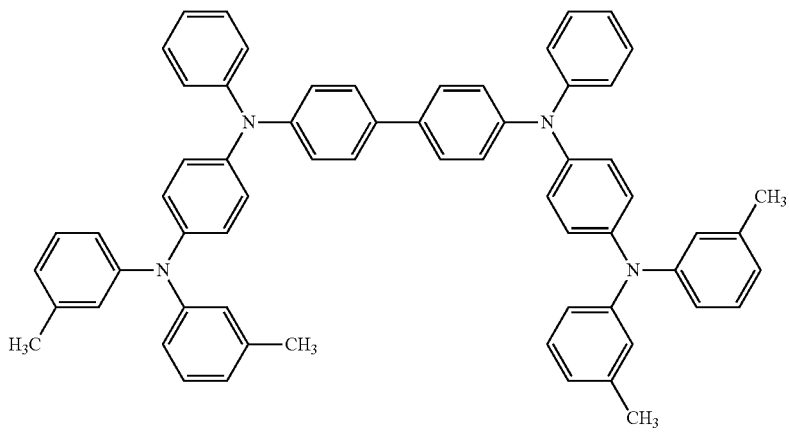

DNTPD

Also, the organic layer preferably has a multi-photon emission structure where a plurality of luminescence units are stacked in series via the electron injection layer and the charge generation layer.

The above layer constitution can be particularly suitably applied to attain a high efficiency of the MPE element as described above.

Advantageous Effects of Invention

According to the organic EL element of the present invention, an electron injection layer can be formed by a film that is suitable and excellent in uniformity, and the charge generation layer capable of sufficiently exhibiting the function can be formed.

Therefore, the organic EL element provided with the electron injection layer and the charge generation layer according to the present invention can attain efficiency improvement. Particularly, in the MPE element, the function of the charge generation layer can be suitably exhibited.

In addition, the present invention enables coating and film forming of the electron injection layer and charge generation layer, and suitably applied also to a hybrid laminated structure combining deposition/coating and organic/inorganic, and development to production of all coating-type organic EL element and all coating-type MPE element is also expected.

DESCRIPTION OF EMBODIMENTS

Hereinafter, the present invention will be described in more detail.

The organic EL element according to the present invention is an organic EL element provided with at least one organic layer between a pair of electrodes, comprising an electron injection layer comprising a ZnO-containing layer, and a charge generation layer containing an electron acceptor-containing film formed in contact with the cathode side thereof and an electron donor-containing film adjacent thereto.

By having the layer constitution as described above, an electron injection layer can be formed by a film that is stable and excellent in uniformity, and an organic EL element provided with the charge generation layer capable of effectively exhibiting the function is obtained, and it is possible to attain improvement of luminous efficiency.

Figure 1:
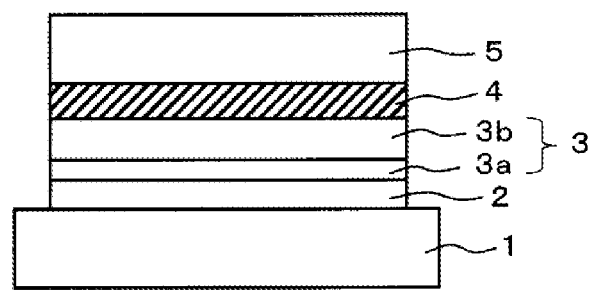
FIG. 1 is a schematic sectional view schematically showing an example of a layer structure of the organic EL element according to the present invention.

Examples of the layer structure of the organic EL element according to the present invention provided with the electron injection layers and charge generation layer as described above specifically include constitutions of anode 1/[electron injection layer 2/charge generation layer 3]/luminescence layer 4/cathode 5 as shown in FIG. 1, and anode/[electron injection layer/charge generation layer]/luminescence layer/electron transport layer/cathode. Here, the charge generation layer 3 comprises electron acceptor-containing film 3a/electron donor-containing film 3b. As described above, [electron injection layer 2/charge generation layer 3] is formed in contact with anode 1, whereby [electron injection layer 2/charge generation layer 3] can be functioned as a hole injection layer.

Also, it is possible to have a constitution of anode/hole transport layer/luminescence layer/electron transport layer/[electron injection layer/charge generation layer]/cathode. As described above, when [electron injection layer/charge generation layer] is formed in contact with cathode, [electron injection layer/charge generation layer] can be functioned as an electron injection layer.

In the above layer structure, a known laminated structure also further containing a hole transport luminescence layer, an electron transport luminescence layer or the like may be used.

Also, in the organic EL element according to the present invention, the organic layer may be a MPE element in which a plurality of luminescence units are stacked in series via the electron injection layer and the charge generation layer. Examples include layer structures of anode/luminescence unit (=hole transport layer/luminescence layer/electron transport layer)/[electron injection layer/charge generation layer]/luminescence unit (=luminescence layer/electron transport layer)/cathode and the like.

The above layer constitution is particularly suitable for attaining a high efficiency of the MPE element as described above.

The ZnO-containing layer comprising the electron injection layer may comprise a ZnO film only or comprises any of a laminate of a ZnO film and a binder film, a mixed film of ZnO and an alkali metal compound, a mixed film of ZnO, an alkali metal compound and a binder, a laminate of a ZnO film and a mixed film of an alkali metal compound and a binder, a mixed film of Zno, an alkaline-earth metal compound and a binder, a laminate of a ZnO film and a mixed film of an alkaline-earth metal compound and a binder, a mixture of ZnO and an organic donor compound, and a laminate of a ZnO film and an organic donor compound film.

The ZnO-containing layer as described above can be formed as a coated film and attain improvement of a film forming property, and is preferably formed by applying a liquid material in which ZnO is dispersed in alcohol.

The type of alcohol used as the solvent for the liquid material is not particularly limited, but an alkali metal compound or alkaline-earth metal compound and the binder need to be soluble, and it is preferable to select and use an alcohol whose volatility is comparatively high, allowing a good film having a flat and smooth surface to be formed after drying. Specifically, the alcohol includes methanol, ethanol, 2-ethoxyethanol, isopropyl alcohol and the like, and particularly, 2-ethoxyethanol is suitably used.

ZnO has conductivity, has high hole block properties (HOMO 7.4 eV), and has good dispersibility in alcohol, thus is suitably used as a coating-type electron injection material.

Also, as described above, ZnO may be used as a mixture with an alkali metal compound or alkaline-earth metal compound, and the alkali metal compound includes alkali metal oxides such as $Li_2O$ and $Cs_2O$, and alkali metal salts such as $Li_2CO_3$ and $Cs_2CO_3$, and is particularly preferably $Cs_2CO_3$. $Cs_2CO_3$ reduces an electron injection barrier to show a good electron injection property, thus is a suitable coating-type electron injection material.

Further, as the alkali metal salt, an alkali metal phenolate salt among alkali metal complexes, particularly, Naq that is a sodium phenolate salt, as well as Liq, Lipp and Libpp that are lithium phenolate salts can also be suitably used. While $Cs_2CO_3$ has deliquescence and is unstable in the atmosphere, the alkali metal phenolate salt has an advantage that it is not only excellent in coating and film forming properties but also stable in the atmosphere, and facilitates the element production.

Furthermore, it is preferred that the mixture of the ZnO and the alkali metal compound or alkaline-earth metal compound is used by further adding a binder thereto.

By adding a binder, it is possible to form a stable film in which the alkali metal compound or alkaline-earth metal compound is homogeneously dissolved to have a suitable film thickness, thereby attaining a high efficiency of the organic electronic device.

It is preferred that the binder is soluble in alcohol which is a solvent for the liquid material to be coated, and a pyridine ring-containing polymer is suitably used, and specifically includes PVPy, PVPhPy, PVBiPy, PVPh2Py and PVPh3Py shown above (Chemical Formula 2), poly(2-vinylpyridine) and the like.

Also, the ZnO-containing layer may be constituted as a laminate of (a mixed film of ZnO film/alkali metal compound and binder) or (a mixed film of ZnO film/alkaline-earth metal compound and binder).

As the molecular weight of the polymer of the binder, it is preferable to have a molecular weight of 10,000 to 100,000 or so, from the viewpoints of solubility in alcohol, dispersibility of the alkali metal compound or alkaline-earth metal compound, film forming property, and the like.

Also, the amount of the binder added is sufficient in so far as the dispersibility and film forming property of the alkali metal compound or alkaline-earth metal compound can be improved, and the binder is preferably added in the range of 5 to 30 wt %, based on the alkali metal compound or alkaline-earth metal compound.

Or, the ZnO-containing layer may be constituted as a mixture of ZnO and an organic donor compound, or a laminate of a ZnO film and an organic donor compound film.

As the organic donor compound, N-DMBI or PEI shown above (Chemical Formula 3) is suitably used.

On the other hand, the electron acceptor-containing film of the charge generation layer, formed in contact with the cathode side of the ZnO-containing layer which is the electron injection layer, may be constituted by an electron acceptor only, or can be constituted by a mixture of an electron acceptor and a binder.

As the electron acceptor, from the viewpoint of promoting generation of charges, it is preferable to use a metal oxide having a Fermi level deeper than $(-A+1.5)$ eV or an organic electron acceptor having a LUMO level deeper than $(-A+1.5)$ eV, when the HOMO level of an electron donor of the electron donor-containing film adjacent to the cathode side of the electron acceptor-containing film is $-A$ eV.

Specifically, $MoO_3$, $WO_3$ or $V_2O_5$ is suitably used as the metal oxide, and any of HAT-CN6, F4-TCNQ and FCuPc is suitably used as the organic electron acceptor.

Further, the binder used by being added to the electron acceptor must not inhibit charge generation.

By adding the binder as described above, coating and film forming properties of the charge generation layer can be improved without degrading the function.

It is necessary that the binder suitably applied to coating and film forming of the electron acceptor-containing film can be formed into a liquid material dissolved in a solvent together with the electron acceptor.

Examples of the binder as described above include NPD, DNTPD, PMMA, PVPhPy and the like. These binders show good solubility when using THF, dichloroethane or DMA as a solvent, and it is possible to show good solubility and stably coat and film-form the electron acceptor-containing film.

The electron donor of the electron donor-containing film adjacent to the cathode side of the electron acceptor-containing film includes arylamine compounds such as NPD and DNTPD that can be also applied as the binder of the electron acceptor-containing film, conjugated polymer compounds such as polythiophene, polyfluorene and polyphenylene vinylene, condensed n conjugated compounds such as pentacene and oligothiophene, zinc phthalocyanine, copper phthalocyanine and the like.

Here, among the constituent layers of the organic EL element, the film forming materials used in the layers other than the electron injection layer and the charge generation layer according to the present invention are not particularly limited but properly selected from known ones and used, and may be either a low molecular material or a high molecular material.

Also, the film thickness of each constituent layer of the organic EL element is properly determined depending on the situation, in consideration of the adaptability between the layers, the whole layer thickness as desired and the like, and the film thickness is usually preferably within the range of 0.5 nm to 5 µm.

The method for forming each layer may be dry processes such as a deposition method and a sputtering method, a method using a nano particle dispersion, and wet processes such as an ink-jet method, a casting method, a dip coating method, a bar coating method, a blade coating method, a roll coating method, a gravure coating method, a flexographic printing method and a spray coating method.

In addition, the electrode may be a known material and have a known structure, and is not particularly limited. For example, a so-called indium tin oxide (ITO) substrate in which a transparent conductive thin film formed on a transparent substrate made of glass or polymer is used, and an ITO electrode is formed on the glass substrate as an anode, is commonly employed. On the other hand, the cathode is formed of a metal or alloy with a low work function (4 eV or less) such as Al, and a conductive compound.

EXAMPLES

Hereinafter, the present invention will be further specifically described with reference to examples. However, the present invention is not limited to these examples.

Each sample of the organic EL element shown below was prepared, and element characteristics were evaluated.

Example 1

Comparison of Presence or Absence of Charge Generation Layer

[Sample A] DNTPD Reference

Using a transparent electrode by a glass substrate provided with ITO as an anode, ZnO and $Cs_2CO_3$ (16 wt %) were dispersed in ethoxyethanol thereon, and spin-coated at 2000 rpm for 40 seconds, then heat-treated at 130° C. for 10 minutes to form an electron injection layer (film thickness of 10 nm).

A solution in which 5 mg of DNTPD was dissolved in 2 ml of THF was spin-coated thereon at 4000 rpm for 30 seconds, then heat-treated at 70° C. for 10 minutes to laminate a film (film thickness of 10 nm) which consists of only a binder not containing an electron acceptor. Furthermore, 5 mg of NPD was deposited to laminate an electron donor-containing film (film thickness of 30 nm).

$Alq_3$ (film thickness of 60 nm) was laminated thereon as a luminescence layer, and further, LiF (film thickness of 0.5 nm) and Al (film thickness of 100 nm) were sequentially laminated as a cathode.

The layer constitution of the organic EL element prepared as described above is simply expressed as ITO/ZnO:$Cs_2CO_3$ 16 wt % (10)/DNTPD (10)/NPD (30)/$Alq_3$ (60)/LiF (0.5)/Al (100).

[Sample B] NPD Reference

An organic EL element comprising the same layer constitution as Sample A, except for changing DNTPD of the binder film of Sample A to NPD, was prepared. This binder film was spin-coated with a solution in which 5 mg of NPD was dissolved in 2 ml of dichloroethane at 2000 rpm for 30 seconds, then heat-treated at 70° C. for 10 minutes to be formed in a film thickness of 10 nm.

[Sample C] HAT-CN6:DNPTD

The organic EL element comprising the layer constitution as shown in FIG. 1 was prepared. Changing the binder film by DNPTD of Sample A to the electron acceptor-containing film 3a comprising a mixture of the electron acceptor HAT-CN6 and the binder DNPTD (10 wt %), the anode 1, the electron injection layer 2, the electron donor-containing film 3b, the luminescence layer 4 and the cathode 5 were formed in the same manner as Sample A.

The electron acceptor-containing film 3a was spin-coated with a solution obtained by mixing DNPTD (10 wt %) to HAT-CN6 and dissolving the mixture in THF, at 5000 rpm for 30 seconds, then heat-treated at 70° C. for 10 minutes to be formed in a film thickness of 10 nm.

[Sample D] HAT-CN6:NPD

The organic EL element comprising the layer constitution as shown in FIG. 1 was prepared. Changing the binder film by NPD of Sample B to the electron acceptor-containing film 3a comprising a mixture of the electron acceptor HAT-CN6 and the binder NPD (10 wt %), the anode 1, the electron injection layer 2, the electron donor-containing film 3b, the luminescence layer 4 and the cathode 5 were formed in the same manner as Sample A.

The electron acceptor-containing film 3a was spin-coated with a solution obtained by mixing NPD (10 wt %) to HAT-CN6 and dissolving the mixture in THF, at 5000 rpm for 30 seconds, then heat-treated at 70° C. for 10 minutes to be formed in a film thickness of 10 nm.

Figure 2:
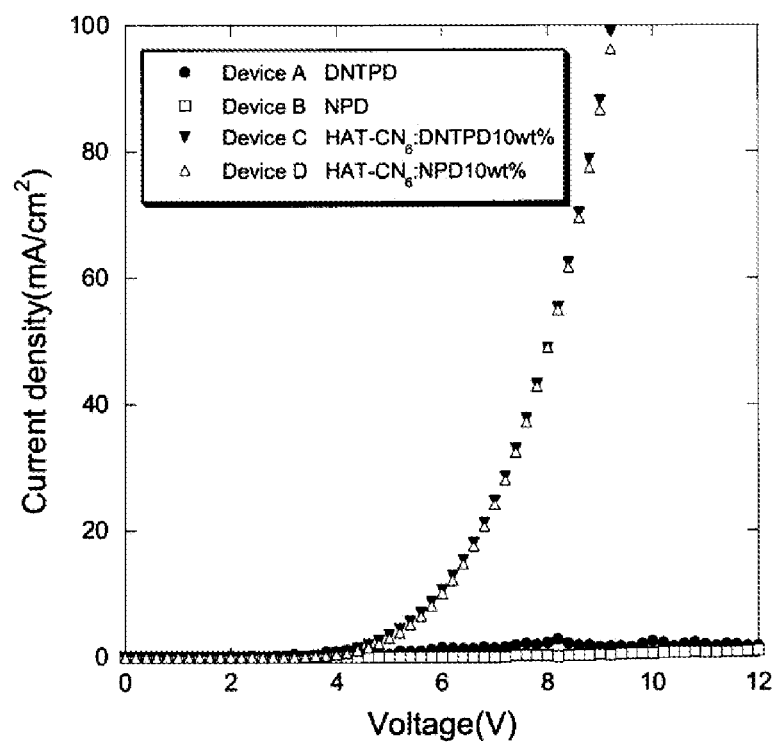
FIG. 2 is a graph showing current density-voltage curves of the organic EL elements of each sample in Example 1.

FIG. 2 shows current density-voltage curves of each organic EL element for Samples A to D.

As can be seen from the curves shown in FIG. 2, elements not using HAT-CN6 (Samples A and B) did not allow few electrons to flow and did not emit light.

On the other hand, elements using HAT-CN6 (Samples C and D) had an external quantum efficiency at 100 cd/m² of 1.2% and 1.0%, respectively. It is considered that this is due to the hole blocking effect of ZnO and since charge was generated when voltage was applied.

Example 2

Comparison of Binder Material of Electron Acceptor-Containing Film

[Sample E] HAT-CN6:PMMA

An organic EL element comprising the same layer constitution as Sample C, except for changing the binder (10 wt %) mixed to the electron acceptor HAT-CN6 (90 wt %) of the electron acceptor-containing film 3a of Sample C to PMMA, was prepared.

The electron acceptor-containing film 3a was spin-coated with a solution obtained by mixing the binder PMMA (10 wt %) to HAT-CN6 and dissolving the mixture in THF, at 5000 rpm for 30 seconds, then heat-treated at 70° C. for 10 minutes to be formed in a film thickness of 10 nm.

[Sample F] HAT-CN6:PVPhPy

An organic EL element comprising the same layer constitution as Sample C, except for changing the binder (10 wt %) mixed to the electron acceptor HAT-CN6 (90 wt %) of the electron acceptor-containing film 3a of Sample C to PVPhPy, was prepared.

The electron acceptor-containing film 3a was spin-coated with a solution obtained by mixing the binder PVPhPy (10 wt %) to HAT-CN6 and dissolving the mixture in DMF, at 2000 rpm for 30 seconds, then heat-treated at 70° C. for 10 minutes to be formed in a film thickness of 10 nm.

Figure 3:
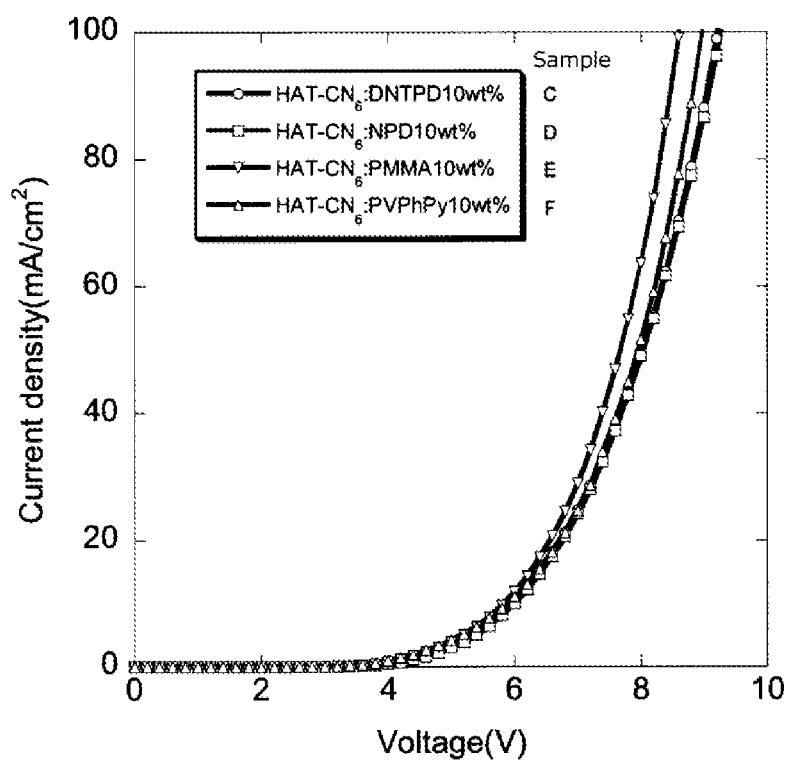
FIG. 3 is a graph showing current density-voltage curves of the organic EL elements of each sample in Example 2.

FIG. 3 shows current density-voltage curves of each organic EL element for Samples C to F.

As can be seen from the curves shown in FIG. 3, it was recognized that nearly equivalent element characteristics were obtained even when using any of DNTPD, NPD, PMMA and PVPhPy as a binder.

Example 3

Comparison of Mixing Ratio of Electron Acceptor and Binder

[Samples G to J] HAT-CN6:DNTPD

Organic EL elements comprising the same layer constitution as Sample C, except for changing the mixing ratio of the electron acceptor HAT-CN6 (90 wt %) and the binder DNTPD (10 wt %) of the electron acceptor-containing film 3a of Sample C to 50 wt % (Sample G), 30 wt % (Sample H), 20 wt % (Sample I) and 10 wt % (Sample J) of HAT-CN6, were prepared.

Figure 4:
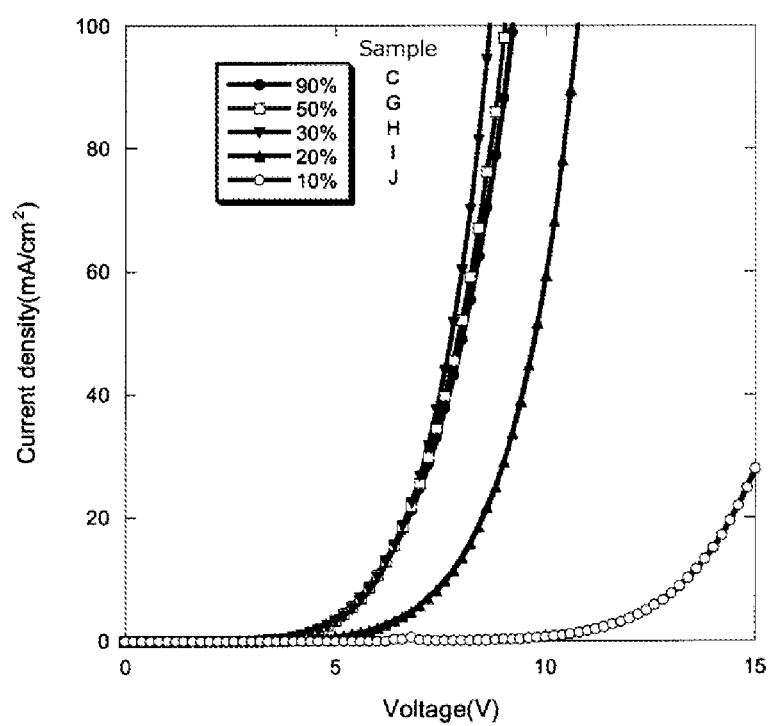
FIG. 4 is a graph showing current density-voltage curves of the organic EL elements of each sample in Example 3.

FIG. 4 shows current density-voltage curves of each organic EL element for Samples C and G to J.

As can be seen from the curves shown in FIG. 4, it was recognized that the generated charge amount was nearly same when the ratio of HAT-CN6 was 30 wt % or more (Samples C, G, H).

Example 4

Comparison of Composition of Electron Injection Layer

[Sample K] ZnO/HAT-CN6:DNPTD

An organic EL element comprising the same layer constitution as Sample C, except for changing the mixed film of ZnO and $Cs_2CO_3$ (16 wt %) in the electron injection layer 2 of Sample C to a coated film which consists of only ZnO, was prepared.

Figure 5:
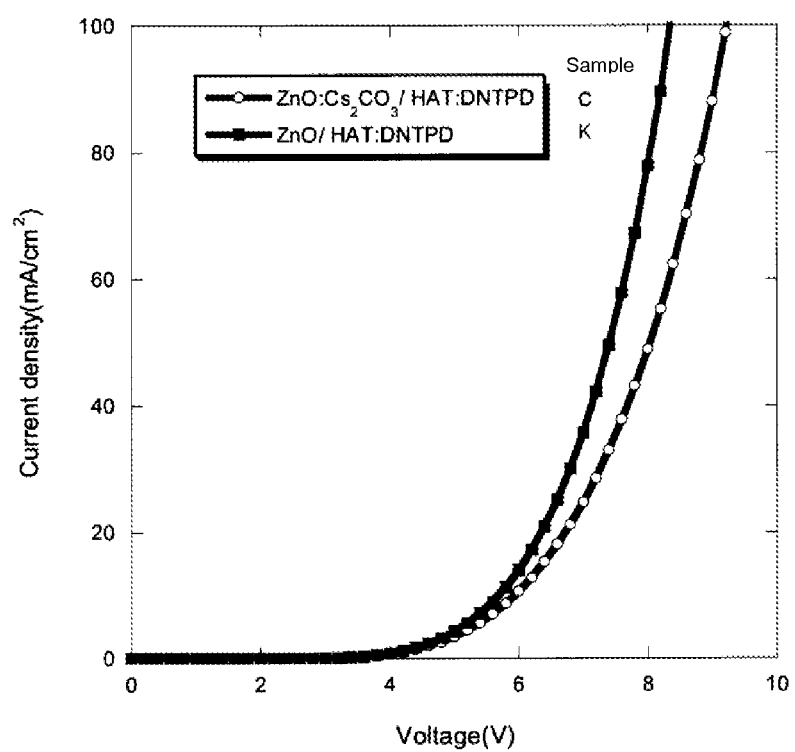
FIG. 5 is a graph showing current density-voltage curves of the organic EL elements of each sample in Example 4.

FIG. 5 shows current density-voltage curves of each organic EL element for Samples C and K.

As can be seen from the curves shown in FIG. 5, it was recognized that nearly equivalent element characteristics were obtained even when using the electron injection layer by a ZnO coated film to which $Cs_2CO_3$ was not mixed (Sample K).

Example 5

Comparison of Coating and Deposition of Electron Acceptor-Containing Film

[Sample L] ZnO/HAT-CN6 Deposition Film

An organic EL element comprising the same layer constitution as Sample K, except for changing the mixed coated film of the electron acceptor HAT-CN6 (90 wt %) and the binder NPD (10 wt %) of the electron acceptor-containing film 3a of Sample K to a deposition film of HAT-CN6 only, was prepared.

Figure 6:
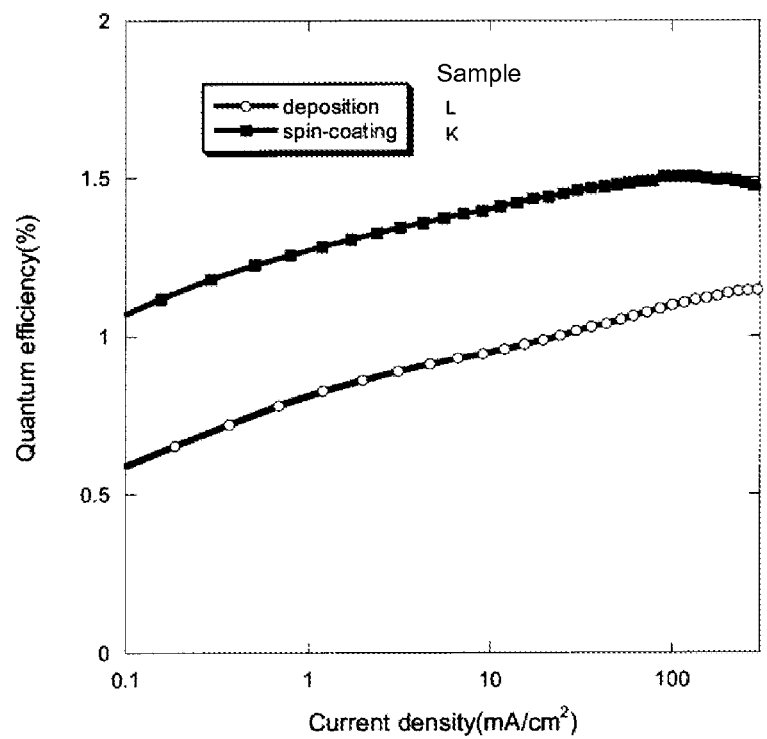
FIG. 6 is a graph showing external quantum efficiency-current density curves of the organic EL elements of each sample in Example 5.

FIG. 6 shows external quantum efficiency-current density curves of each organic EL element for Samples K and L.

As can be seen from the curves shown in FIG. 6, it was recognized that the external quantum efficiency was more improved when the electron acceptor-containing film was formed by a coating method (Sample K) as compared to a deposition method (Sample L).

Example 6

ZnO-Containing Layer Using Organic Donor Compound

[Sample M] ZnO:N-DMBI

Using a transparent electrode by a glass substrate provided with ITO (film thickness of 130 nm) as an anode, PEDOT:PSS (Clevios(trademark) PAI4083 manufactured by Heraeus Materials Technology) was spin-coated thereon at 2500 rpm for 30 seconds in the atmosphere, then heat-treated at 120° C. for 10 minutes to form a hole injection layer (film thickness of 40 nm).

A 7 mg/ml p-xylene solution of HT-12 manufactured by Sumitomo Chemical Company, Limited was prepared, and was spin-coated thereon at 4000 rpm for 10 seconds in a nitrogen atmosphere, then heat-treated at 180° C. for 1 hour to laminate a hole transport layer (film thickness of 20 nm).

A 12 mg/ml p-xylene solution of Green polymer (Green 1305 manufactured by Sumitomo Chemical Company, Limited) was prepared, and was spin-coated thereon at 3000 rpm for 30 seconds in a nitrogen atmosphere, then heat-treated at 130° C. for 10 minutes to laminate a luminescence layer (film thickness of 80 nm).

A 10 mg/ml solution (ethoxyethanol:chloroform=4:1) of ZnO and a 2.0 mg/ml ethoxyethanol solution of N-DMBI were mixed to prepare a solution of ZnO and N-DMBI (17 wt %), and was spin-coated thereon at 2500 rpm for 20 seconds, then irradiated with UV light for 30 minutes to laminate an electron injection layer (ZnO-containing layer) (film thickness of 10 nm).

HAT-CN6 was film-formed by vacuum deposition to form an electron acceptor-containing film (film thickness of 5 nm) thereon, then the compound shown below (TPT-1) was film-formed by vacuum deposition to form an electron donor-containing film (20 nm) thereon, and further Al (film thickness of 100 nm) was laminated by vacuum deposition as a cathode.

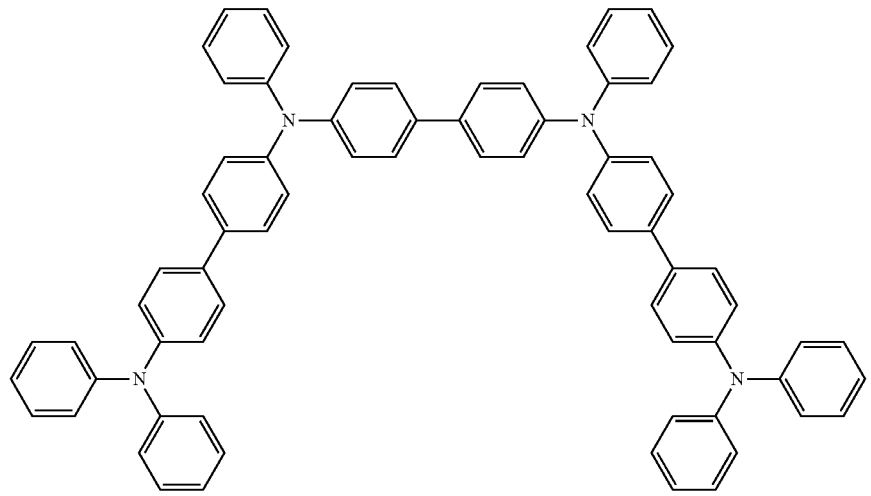

TPT-1

The layer constitution of the organic EL element prepared as described above is simply expressed as ITO (130)/ PEDOT:PSS (40)/HT-12 (20)/Green 1305 (80)/ZnO:N-DMBI (17 wt %) (10)/HAT-CN6 (5)/TPT-1 (20)/Al (100).

[Samples N, O] PEI/ZnO/PEI

An organic EL element comprising the same layer constitution as Sample M, except for changing the mixed film of ZnO and N-DMBI (17 wt %) of the electron injection layer (ZnO-containing layer) of Sample M to a coated film of PEI (film thickness of 4 nm)/ZnO (film thickness of 10 nm)/PEI (film thickness of 4 nm) laminate, was prepared.

A 0.74 mg/ml ethoxyethanol solution of PEI was prepared, and was spin-coated at 5000 rpm for 30 seconds in a nitrogen atmosphere to form a PEI film. Also, a 10 mg/ml ethoxyethanol:chloroform=4:1 solution of ZnO was prepared, and was spin-coated at 2500 rpm for 20 seconds in a nitrogen atmosphere to form a ZnO film.

Here, PEI having a number-average molecular weight of about 10,000 and a weight-average molecular weight of about 25,000 was used in Sample M, and PEI having a number-average molecular weight of about 600 and a weight-average molecular weight of about 800 was used in Sample N.

Figure 7:
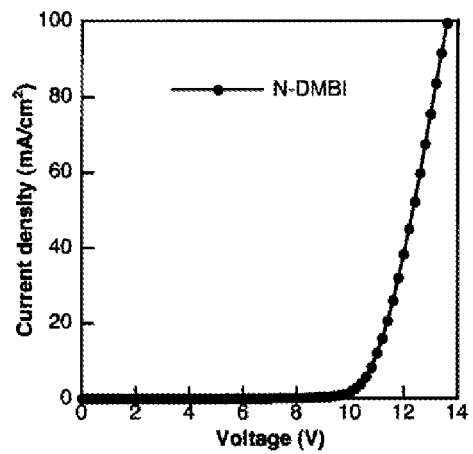
FIG. 7 is a graph showing a current density-voltage curve of the organic EL elements of sample M in Example 6.
Figure 8:
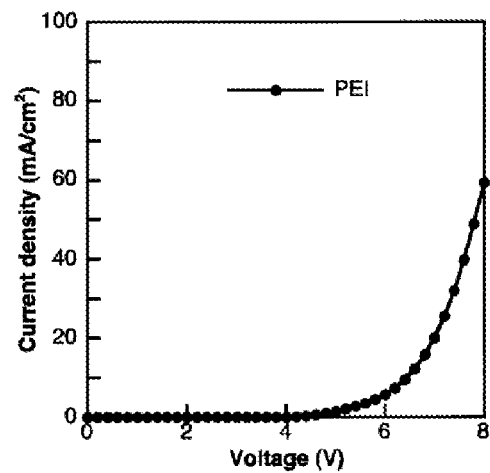
FIG. 8 is a graph showing a current density-voltage curve of the organic EL elements of sample N in Example 6.
Figure 9:
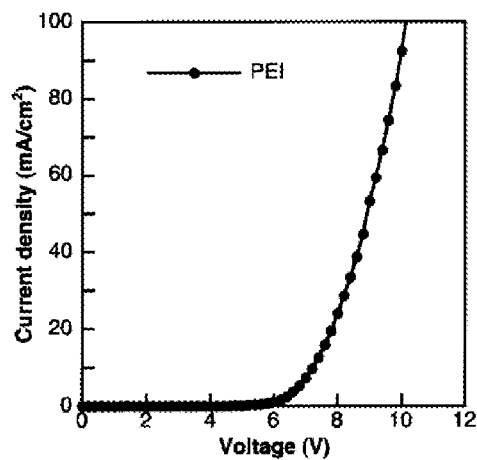
FIG. 9 is a graph showing a current density-voltage curve of the organic EL elements of sample O in Example 6.

FIGS. 7 to 9 respectively show a current density-voltage curve of each organic EL element for Samples M to O.

It was confirmed to emit light also when an electron injection layer was formed by combining ZnO and an organic donor compound.

REFERENCE SIGNS LIST

1 Anode
2 Electron injection layer
3 Charge generation layer
3a Electron acceptor-containing film
3b Electron donor-containing film
4 Luminescence layer
5 Cathode

The invention claimed is:

1. An organic electroluminescent element provided with at least one organic layer between an anode and a cathode, comprising:
   a) an electron injection layer comprising a ZnO-containing layer, and
   b) a charge generation layer containing i) an electron acceptor-containing film formed in contact with the cathode side of the electron injection layer and ii) an electron donor-containing film adjacent to the electron acceptor-containing film.

2. The organic electroluminescent element according to claim 1, wherein the ZnO-containing layer comprises any of a ZnO film only, a laminate of a ZnO film and a binder film, a mixed film of ZnO and an alkali metal compound, a mixed film of ZnO, an alkali metal compound and a binder, a laminate of a ZnO film and a mixed film of an alkali metal compound and a binder, a mixed film of ZnO, an alkaline-earth metal compound and a binder, a laminate of a ZnO film and a mixed film of an alkaline-earth metal compound and a binder, a mixture of ZnO and an organic donor compound, and a laminate of a ZnO film and an organic donor compound film.

3. The organic electroluminescent element according to claim 2, wherein the alkali metal compound is any lithium phenolate salt among lithium oxide, cesium oxide, lithium carbonate, cesium carbonate, sodium 8-quinolinolate, lithium 8-quinolinolate, lithium 2-(2-pyridyl)phenolate, and lithium 2-(2',2"-bipyridine-6'-yl)phenolate.

4. The organic electroluminescent element according to claim 2, wherein the binder is any of poly(4-vinylpyridine), poly(2-vinylpyridine), poly[4-(4-vinylphenyl)pyridine], poly[5-vinyl-2,2'-bipyridine], poly[2-(4-vinylphenyl)pyridine], and poly[3-(4-vinylphenyl)pyridine].

5. The organic electroluminescent element according to claim 2, wherein the organic donor compound is any of a group of compounds shown in the following (Chemical Formula 1)

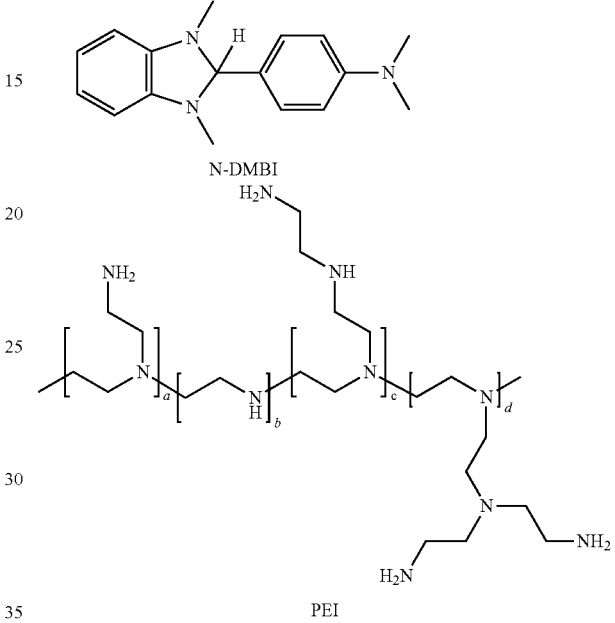

[Chemical Formula 1]

N-DMBI

PEI a, b, c and d are natural numbers.

6. The organic electroluminescent element according to claim 1, wherein the electron acceptor-containing film comprises an electron acceptor only, or a mixture of an electron acceptor and a binder.

7. The organic electroluminescent element according to claim 5, wherein the electron acceptor is a metal oxide having a Fermi level deeper than (−A +1.5) eV or an organic electron acceptor having a LUMO level deeper than (−A +1.5) eV, based on HOMO level (−A eV) of an electron donor of the electron donor-containing film adjacent to the cathode side of the electron acceptor-containing film.

8. The organic electroluminescent element according to claim 5, wherein the electron acceptor is any of molybdenum oxide, tungsten oxide, vanadium oxide, 1,4,5,8,9,11-hexaazatriphenylene-hexacarbonitrile, 2,3,5,6-tetrafluoro-7,7,8,8-tetracyanoquinodimethane, and fluorinated copper phthalocyanine.

9. The organic electroluminescent element according to claim 6, wherein the binder comprising a mixture with the electron acceptor is any of N,N'-di[(1-naphthalenyl)-N,N'-diphenyl]-1,1'-biphenyl)-4,4'-diamine, N,N'-diphenyl-N,N'-bis[4-[bis(3-methylphenyl)amino]phenyl]-1,1'-biphenyl-4,4'-diamine, polymethyl methacrylate, and poly[4-(4-vinylphenyl)pyridine].

10. The organic electroluminescent element according to claim 1, wherein the organic layer has a multi-photon emission structure where a plurality of luminescence units are stacked in series via the electron injection layer and the charge generation layer.

* * * * *